(12) United States Patent
Akaike et al.

(10) Patent No.: US 8,082,977 B2
(45) Date of Patent: Dec. 27, 2011

(54) CERAMIC MOUNTING FOR WAFER APPARATUS WITH THERMAL EXPANSION FEATURE

(75) Inventors: Yutaka Akaike, Nirasaki (JP); Munetoshi Nagasaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1150 days.

(21) Appl. No.: 11/684,828

(22) Filed: Mar. 12, 2007

(65) Prior Publication Data
US 2007/0221363 A1 Sep. 27, 2007

(30) Foreign Application Priority Data

Mar. 13, 2006 (JP) ................. 2006-068390
Aug. 8, 2006 (JP) ................. 2006-216197
Feb. 8, 2007 (JP) ................. 2007-029837

(51) Int. Cl.
*H05B 3/10* (2006.01)
*H05B 3/06* (2006.01)
*H05B 3/16* (2006.01)
*H05B 3/20* (2006.01)
*H05B 3/68* (2006.01)
*H01L 21/66* (2006.01)

(52) U.S. Cl. ........ 165/61; 165/80.1; 165/80.2; 165/80.4; 165/80.5; 324/750.03; 324/750.08; 219/444.1; 118/724; 118/725; 156/345.52; 156/345.53; 204/298.15

(58) Field of Classification Search ........... 165/61, 165/80.1, 80.2, 80.4, 80.5; 324/760, 750.03, 324/750.08; 219/444.1; 118/724, 725; 156/345.52, 156/345.53; 204/298.15
See application file for complete search history.

(56) References Cited

U.S. PATENT DOCUMENTS

| | | | | |
|---|---|---|---|---|
| 4,559,244 A | * | 12/1985 | Kasprzyk et al. | 427/227 |
| 5,716,133 A | * | 2/1998 | Hosokawa et al. | 374/121 |
| 6,605,955 B1 | * | 8/2003 | Costello et al. | 324/760 |
| 7,331,097 B2 | * | 2/2008 | Stone et al. | 165/80.1 |
| 7,425,838 B2 | * | 9/2008 | Itakura et al. | 324/754 |
| 7,518,358 B2 | * | 4/2009 | Dunklee | 324/158.1 |
| 2005/0011768 A1 | * | 1/2005 | Stone et al. | 165/80.1 |

FOREIGN PATENT DOCUMENTS

JP  05036818 A  *  2/1993
JP  2002203664 A  *  7/2002

* cited by examiner

*Primary Examiner* — John Ford
(74) *Attorney, Agent, or Firm* — Oblon, Spivak, McClelland, Maier & Neustadt, L.L.P.

(57) ABSTRACT

A mounting apparatus includes a surface plate; a temperature control unit integrated with the surface plate; and a bottom plate integrated with the temperature control unit via a heat insulation ring, wherein a temperature of a target object held on the surface plate is capable of being controlled and the surface plate is formed of ceramic. The surface plate and the temperature control unit are coupled to each other by a first coupling member at each portion thereof except for each peripheral portion thereof such that the peripheral portion of the surface plate being not coupled thereto. The peripheral portion of the temperature control unit is coupled to the heat insulation ring by a second coupling member.

9 Claims, 3 Drawing Sheets

CERAMIC MOUNTING FOR WAFER APPARATUS WITH THERMAL EXPANSION FEATURE

FIELD OF THE INVENTION

The present invention relates to a mounting apparatus for mounting thereon a target object and controlling the target object to a specific temperature in processing the target object such as a wafer; and, more particularly, to a mounting apparatus capable of improving a temperature control function and ensuring lightweight.

BACKGROUND OF THE INVENTION

A conventional mounting apparatus includes, for example, as shown in FIG. 5, a top plate 1, a temperature control unit 4 formed of a cooling jacket 2 and a plate heater 3 integrated with the top plate 1, and a heat insulation plate 6 integrated with the temperature control unit 4 through a heat insulation ring 5, and has a configuration that a wafer (not shown) is attractively held on a top surface of the top plate 1, and controlled to a specific temperature by the temperature control unit 4, whereby a specific process is performed on the wafer. The top plate 1, the cooling jacket 2 and the plate heater 3 are coupled together in an inner portion (except for a central portion) of the heat insulation ring 5 by a plurality of bolts 7A arranged in a concentric circular shape at specific intervals along its Circumferential direction to thereby be integrally formed as the temperature control unit 4. Further, each center of the cooling jacket 2 and the plate heater 3 is fixed together by a bolt 7B. Furthermore, the heat insulation ring 5 is coupled to the top plate 1 and the cooling jacket 2 by a bolt 7C, while it is coupled to the heat insulation plate 6 by a bolt 7D. Meanwhile, reference numeral 8 of FIG. 5 is an insulation sheet.

Moreover, the top plate 1 is made of a material having an excellent thermal conductivity such as copper or aluminum. The surface of the top plate 1 is coated with gold, nickel or the like to prevent oxidation of the top plate 1. Further, the cooling jacket 2 has therein a coolant path 2A through which a coolant flows so that the wafer can be cool down to a specific temperature by the coolant. The plate heater 3 heats the wafer to a specific temperature through the cooling jacket 2 and the top plate 1. In addition, the temperature control unit 4 and the heat insulation plate 6 are spaced apart from each other by the heat insulation ring 5, thereby being heat-insulated from each other.

Meanwhile, the mounting apparatus is configured to attract and hold the wafer on the top plate 1 and control the temperature of the wafer based on an inspection temperature from a low temperature of minus several −10° C. to a high temperature up to +150° C. For this, the mounting apparatus which is hardly thermally deformed as a whole, and has a small heat capacity and an excellent thermal conductivity is required, and at the same time, lightweight of the mounting apparatus itself is also required. Furthermore, in order to enhance the adhesivity and the thermal conductivity between the top plate 1 and the wafer, it is also required to improve the flatness of the top plate 1.

However, since the conventional mounting apparatus produces the flatness of the mounting surface by surface processing the top plate 1, and therefore, the internal stress of the top plate 1 increases while the top plate 1 is surface-processed, the flatness of only about 5 μm is obtained. Further, since the top plate 1 is made of a metal to be easily deformed, if the cooling jacket 2 has bad flatness, the flatness of the top plate 1 is deteriorated under the influence of the cooling jacket 2. Furthermore, the top plate 1 and the cooling jacket 2 are coupled together by the bolts 7A and 7C over the entire surface thereof except for the central portion, and further formed of different metals. Therefore, due to a difference between each thermal expansion rate, it is noted that the top plate 1 is thermally deformed at a temperature range, for example, from +25° C. to +150° C., and thus, the flatness is deteriorated from 5 μm to 10 μm. Meanwhile, thickening the top plate 1 can be considered in order to reduce the influence of the cooling jacket 2. However, in this case, the heat capacity increases as the top plate 1 is thickened. Therefore, a time required for raising and lowering the temperature of the wafer becomes longer and at the same time the top plate 1 itself becomes heavy. Further, since the top plate 1 is fixed to the cooling jacket 2 and the heat insulation ring 5, when assembled, it can be known that the flatness of the assembled top plate 1 is deteriorated under the influence of the cooling jacket 2 and the heat insulation ring 5.

Further, Japanese Patent Laid-open Application No. H5-036818 discloses therein a wafer chuck formed of ceramic, i.e. SiC impregnated with Si, while Japanese Patent Laid-open Application Nos. 2005-072039 and 2000-066710 disclose a vacuum chuck using the ceramic identical with that of Japanese Patent Laid-open Application No. H5-036818.

SUMMARY OF THE INVENTION

It is, therefore, an object of the present invention to provide a mounting apparatus capable of shortening a time required for raising and lowering a temperature of a target object and realizing lightweight by enhancing a thermal conductivity by way of improving the flatness of an assembled surface plate and at the same time suppressing the deterioration of the flatness of the surface plate by the temperature variation from a low temperature to a high temperature.

In accordance with one aspect of the present invention, there is provided a mounting apparatus including:

a surface plate;

a temperature control unit integrated with the surface plate; and a bottom plate integrated with the temperature control unit via a heat insulation ring, wherein a temperature of a target object held on the surface plate is capable of being controlled, wherein the surface plate is formed of ceramic, wherein the surface plate and the temperature control unit are coupled to each other by a first coupling member at each portion thereof except for each peripheral portion thereof such that the peripheral portion of the surface plate being not coupled thereto, and wherein the peripheral portion of the temperature control unit is coupled to the heat insulation ring by a second coupling member.

It is preferable that the first coupling member includes a plurality of coupling members arranged in a concentric circular shape with respect to the surface plate and the temperature control unit.

In accordance with another aspect of the present invention, there is provided a mounting apparatus including:

a surface plate;

a temperature control unit integrated with the surface plate; and a bottom plate integrated with the temperature control unit through a heat insulation ring, wherein a temperature of a target object held on the surface plate is capable of being controlled, wherein the surface plate is formed of ceramic, wherein the surface plate and the temperature control unit are coupled to each other at each central portion by a coupling member, and wherein the temperature control unit is inserted between the surface plate and the heat insulation ring.

It is preferable that the surface plate and the heat insulation ring are coupled to each other via the temperature control unit at a plurality of places spaced apart from each other in a circumferential direction by coupling members different from each other.

It is preferable that each thermal expansion of the surface plate and the heat insulation ring is substantially equal to each other at coupling part.

It is preferable that the mounting apparatus further includes a temperature control plate ring attached to the bottom plate for surrounding the surface plate, the temperature control unit and the heat insulation ring, wherein a gap is formed between the temperature control plate ring and a peripheral surface of the surface plate, the temperature control plate ring, and the heat insulation ring.

It is preferable that both sides of the temperature control plate ring is formed of a mirror surface.

It is preferable that the temperature control plate ring is made of a material having a thermal conductivity equal to or lower than 17 W/mK.

It is preferable that an insulation sheet is interposed between the surface plate and the temperature control unit.

It is preferable that the temperature control unit is formed of a cooling element and/or a heating element.

It is preferable that the ceramic is a composite material of silicon carbide and silicon.

In accordance with embodiments of the present invention, there is provided a mounting apparatus capable of shortening a time required for raising and lowering a temperature of a target object and realizing lightweight by enhancing a thermal conductivity by way of improving the flatness of an assembled surface plate and at the same time suppressing the deterioration of the flatness of the surface plate by the temperature variation from a low temperature to a high temperature.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE PREFERRED EMBODIMENTS

Figure 1:
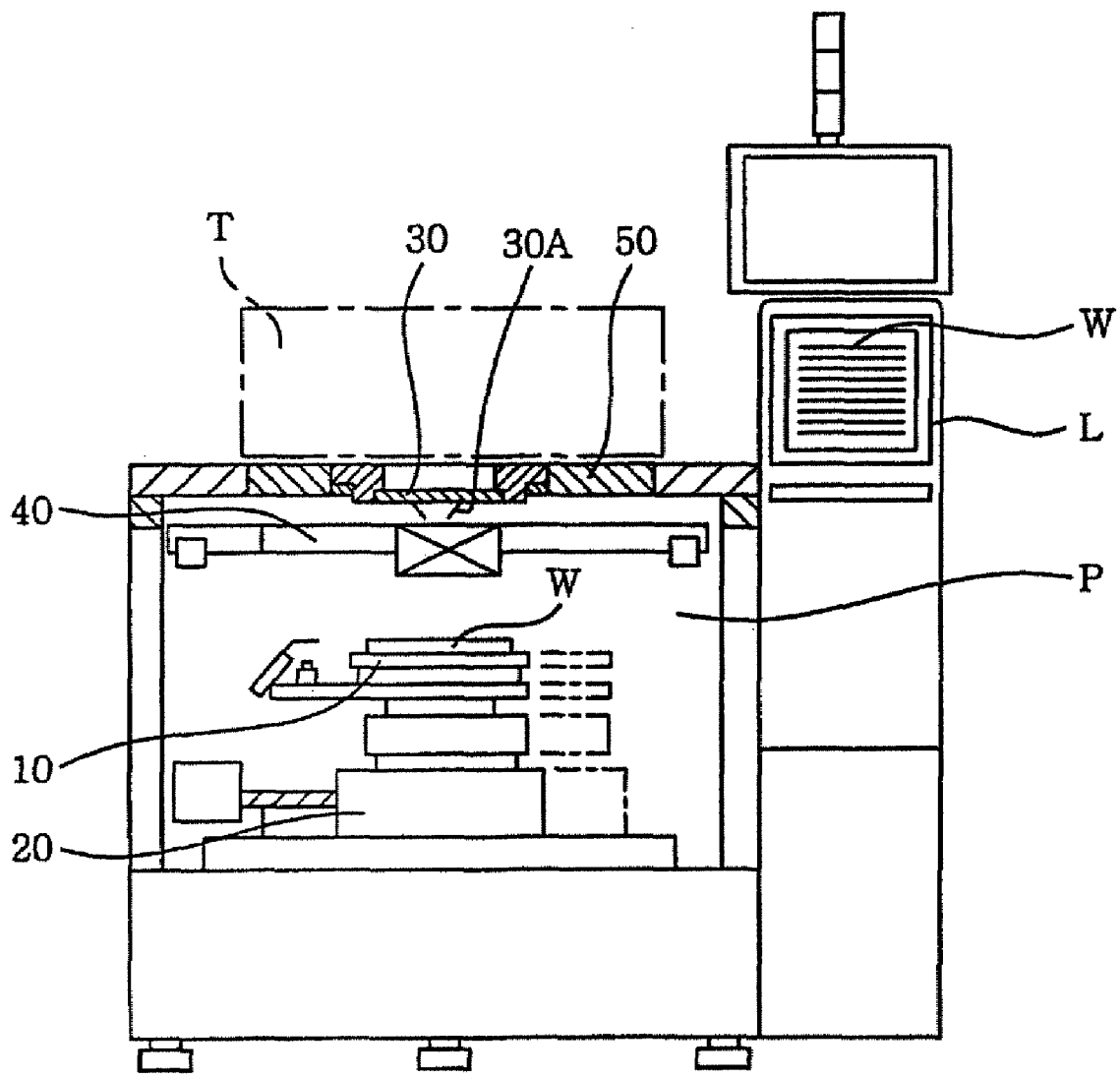
FIG. 1 is a front view showing an interior of an inspection apparatus in which a mounting apparatus of the present invention is employed.
Figure 2:
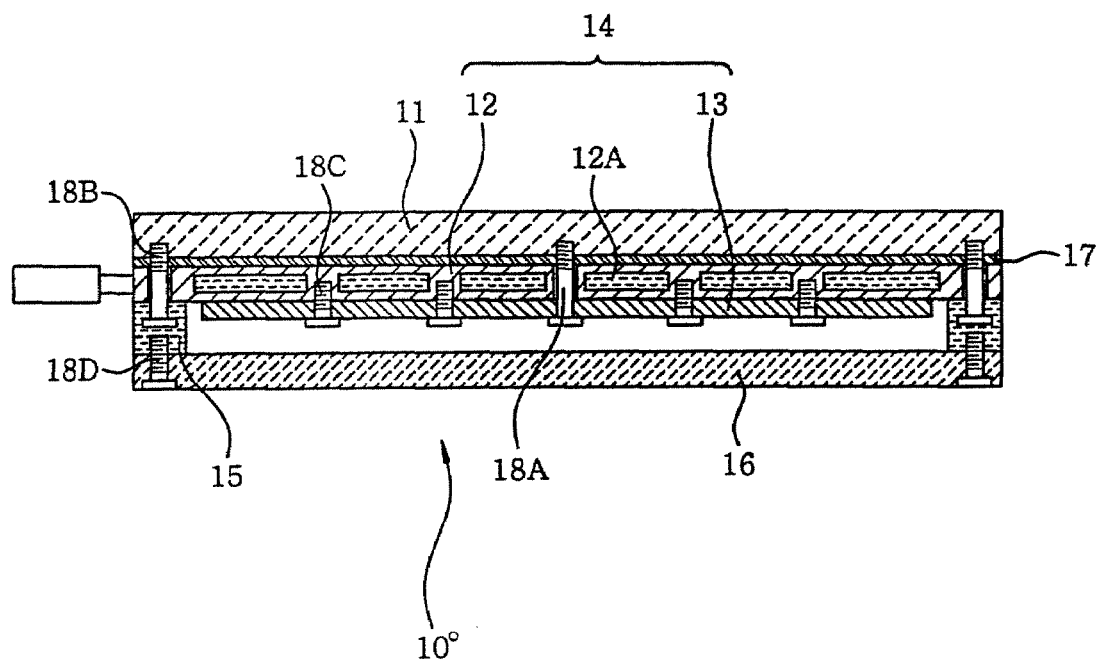
FIG. 2 is a cross sectional view illustrating the mounting apparatus shown in FIG. 1.
Figure 3:
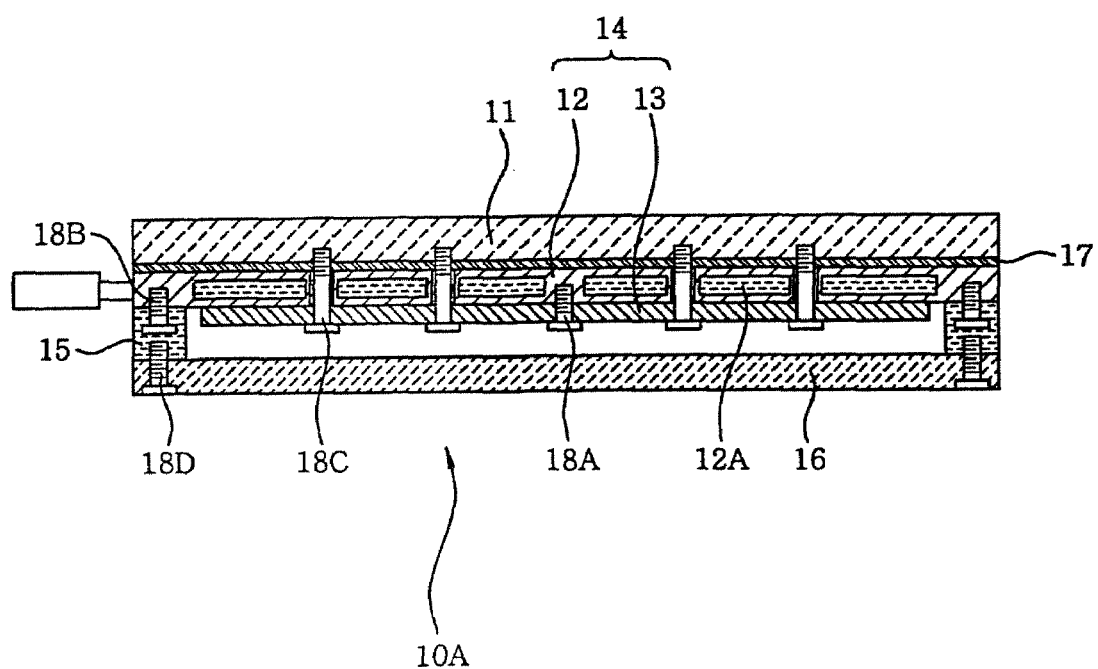
FIG. 3 is a cross sectional view of a mounting apparatus in accordance with another embodiment of the present invention.
Figure 4:
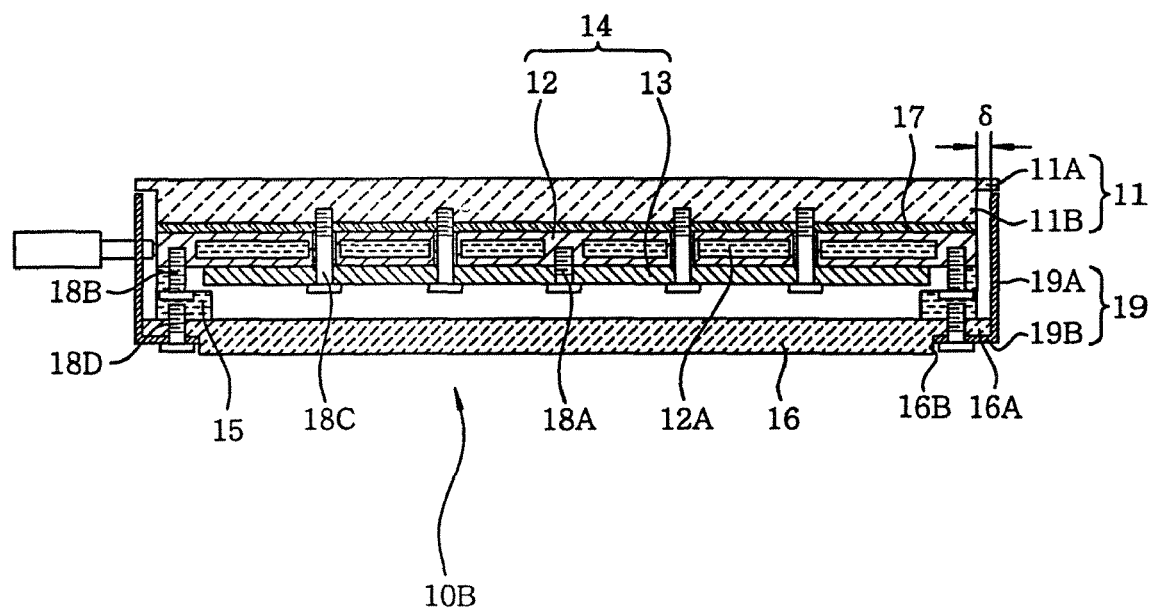
FIG. 4 is a cross sectional view of a mounting apparatus in accordance with still another embodiment of the present invention.
Figure 5:
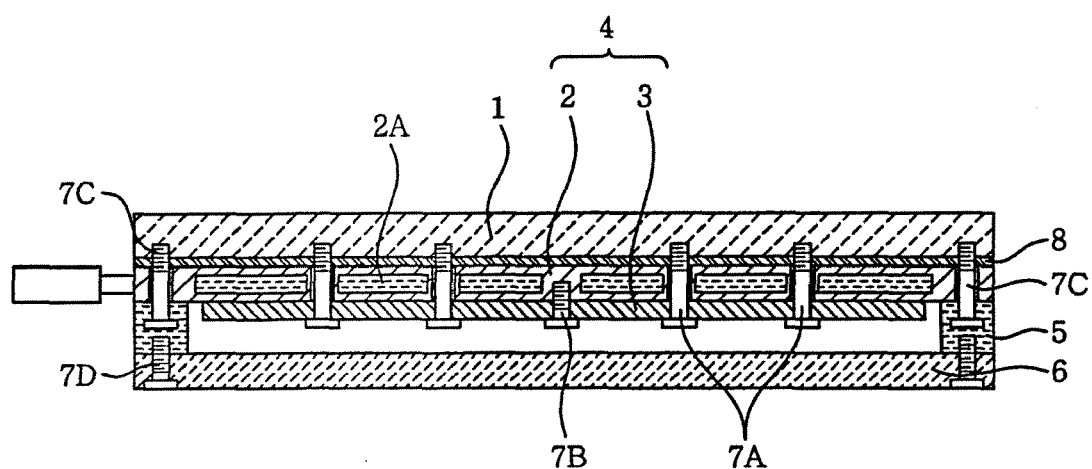
FIG. 5 is a cross sectional view showing an exemplified conventional mounting apparatus.

Hereinafter, embodiments of the present invention will be described with reference to FIGS. 1 to 4. FIG. 1 is a front view showing an interior of an inspection apparatus in which a mounting apparatus of the present invention is employed; FIG. 2 is a cross sectional view illustrating the mounting apparatus shown in FIG. 1; FIG. 3 is a cross sectional view of a mounting apparatus in accordance with another embodiment of the present invention, and FIG. 4 is a cross sectional view of a mounting apparatus in accordance with still another embodiment of the present invention.

First Embodiment

First, the inspection apparatus in which the mounting apparatus of this embodiment is employed will be described. This inspection apparatus includes, for example, as shown in FIG. 1, a loader chamber L for transferring a wafer W, a prober chamber P for inspecting electrical characteristics of the wafer W transferred from the loader chamber L and a control unit (not shown), and is configured such that, under the control of the control unit, the wafer W is transferred from the loader chamber L to the prober chamber P, the electrical characteristics of the wafer W is inspected in the prober chamber P, and then, the wafer W is returned to its initial position.

The prober chamber P has a temperature-controllable mounting apparatus (wafer chuck) 10 for mounting thereon the wafer, an XY table 20 for moving the wafer chuck 10 in X and Y directions, a probe card 30 disposed above the wafer chuck 10 moved by the XY table 20, and a position alignment mechanism 40 which enables a plurality of probes 30A of the probe card 30 to be precisely aligned to a plurality of electrode pads of the wafer W mounted on the wafer chuck 10.

Further, as shown in FIG. 1, a revolvable test head T of a tester is disposed on a head plate 50 of the prober chamber P and is electrically connected with the probe card 30 through a performance board (not shown). Furthermore, by setting an inspection temperature of the wafer W mounted on the wafer chuck 10, for example, at a temperature ranging from −50° C. to +150° C., and sending inspection signals from the tester to the probes 30A though the test head T and the performance board, the inspection of the electrical characteristics of the wafer W is performed.

The wafer chuck 10 of the embodiment includes, for example, as shown in FIG. 2, a surface plate (top plate) 11, a temperature control unit 14 formed of a cooling element (cooling jacket) 12 and a heating element (plate heater) 13 integrated with the top plate 11, and a bottom plate (heat insulation plate) 16 integrated with the temperature control unit 14 through a heat insulation ring 15, the bottom plate 16 being formed of a heat insulating material such as ceramic. Further, under the control of a control unit (not shown), the temperature control unit 14 sets the wafer mounted on the top plate 11 to a specific inspection temperature. Furthermore, an insulation sheet 17 made of e.g., silicon rubber having an excellent uniform-heating capability is interposed between the top plate 11 and the cooling jacket 12 to uniformly control the temperature of an entire surface of the top plate 11.

The top plate 11, the insulation sheet 17 and the cooling jacket 12 are formed to have a substantially uniform outer diameter, whereas the plate heater 13 is formed to have a smaller outer diameter. The heat insulation ring 15 is disposed at an outside of the plate heater 13. A female screw portion is formed at a central portion of the top plate 11, while a through hole is formed at each central portion of the insulation sheet 17, the cooling jacket 12 and the plate heater 13. Further, the top plate 11, the cooling jacket 12 and the plate heater 13 are fixed at each central portion by a first bolt 18A and therefore integrated with each other. In other words, the first bolt 18A is driven from a side of the plate heater 13 into the female screw portion disposed in the top plate 11 via each through hole of the plate heater 13, the cooling jacket 12 and the insulation sheet 17, whereby the top plate 11, the insulation sheet 17, the cooling jacket 12 and the plate heater 13 are coupled with each other.

The heat insulation ring 15 has an inner diameter larger than the outer diameter of the plate heater 13, and an outer diameter substantially the same as that of the top plate 11, the insulation sheet 17 and the cooling jacket 12. Further, the top plate 11, the insulation sheet 17, the cooling jacket 12 and the heat insulation ring 15 are fixed with each other by another coupling member (second bolt) 18B. That is, each of the heat insulation ring 15, the cooling jacket 12, and the insulation sheet 17 is provided with a plurality of through holes vertically corresponding to each other, which is formed at specific intervals in a circumferential direction, whereas the top plate 11 has female screw portions corresponding to the through holes. Further, each second bolt 18B is driven from a side of the heat insulation ring 15 into each female screw portion disposed in the top plate 11 via each through hole of the heat insulation ring 15, the cooling jacket 12 and the insulation sheet 17 so that the insulation sheet 17 and the cooling jacket 12 can be inserted between the top plate 11 and the heat insulation ring 15.

The second bolt 18B, as will be described below, is disposed at a position where thermal expansion of the top plate 11 and the heat insulation ring 15 becomes equal to each other, and therefore the top plate 11 and the heat insulation ring 15 are thermally expanded or contracted together by the same amount, whereby the constant flatness can be maintained without deforming the top plate 11 even during a heating or cooling process. Further, the cooling jacket 12 and the plate heater 13 are integrally by a plurality of third bolts 18C which are arranged in a concentric circular shape at specific intervals along a circumferential direction, but not connected to the top plate 11. Thus, the cooling jacket 12 is expansible and contractible with the first bolt 18A as a center. The through holes formed through a peripheral portion of the cooling jacket 12 are designed to be able to absorb expansion and contraction of the top plate 11 and the heat insulation ring 15. With respect to the shape of the through holes, a though hole whose inner diameter is larger than an outer diameter of the second bolt 18B, or a long though hole elongated in a diametrical direction of the cooling jacket 12 can be employed.

Meanwhile, a plurality of through holes are formed through a peripheral portion of the heat insulation plate 16 at specific intervals in a circumferential direction, while a plurality of female screw portions corresponding to the through holes of the heat insulation plate 16 is formed in the heat insulation ring 15. Further, each fourth bolt 18D is driven from a side of the heat insulation plate 16 into each female screw portion disposed in the heat insulation ring 15 via each through hole of the heat insulation plate 16 in such a manner that the heat insulation plate 16 is integrated with the temperature control unit 14 through the heat insulation ring 15. Although the fourth bolt 18D is arranged in a line with the second bolt 18B in FIG. 2, actually, the axis of the fourth bolt 18D is misaligned with that of the second bolt 18B in a circumferential direction.

Further, the top plate 11 is formed of ceramic, i.e. a SiC sintered body impregnated with Si (e.g., product number PSS50, manufactured by CERATECH JAPAN Co., Ltd). A volumetric ratio of SiC to Si in this ceramic is controlled to be 50:50. The volumetric ratio thereof is not limited thereto, but can be appropriately modified as occasion demands. Further, since the internal stress of this ceramic is hardly accumulated in surface processing, the surface processing with the flatness of about 2 μm can be performed. Furthermore, compared with the copper for forming the conventional top plate, this ceramic has a third of the specific gravity, a fifth of the thermal expansion rate and 2.3 times of the stiffness. Therefore, the top plate 11 formed of this ceramic is lighter than the conventional one, and barely affected by deformation of the cooling jacket 12 due to its high stiffness. Further, since the surface of the top plate 11 is not oxidized, the surface processing such as coating is not necessary such that the top plate 11 can be used throughout life.

Further, although the cooling jacket 12 is formed of copper like in a conventional way, it is thinner than the conventional one, and thus, it becomes lighter as it is thinner. Meanwhile, reference numeral 12A is a coolant path.

Furthermore, the heat insulation ring 15 is, e.g., formed of mica. Since the thermal expansion rate of the heat insulation ring 15 is greater than that of the top plate 11, the second bolt 18B is disposed at a position where the thermal expansion of the top plate 11 and the heat insulation ring 15 becomes equal to each other such that the top plate 11 and the heat insulation ring 15 are expanded or contracted together by the same amount. That is, since the heat insulation ring 15 has a vertical temperature distribution, there exists a position, apart from the cooling jacket 12, where the heat insulation ring 15 is thermally expended as much as the top plate 11. By using this position as a reference, a position of the second bolt 18B in a diametrical direction is decided to thereby arrange the second bolt 18B.

The heat insulation plate 16 is formed of, e.g., ceramic such as alumina like in a conventional way. However, the heat insulation plate 16 is formed to be thinner than the conventional one like the cooling jacket 12. The thickness of the heat insulation ring 15 is increased by the reduced thickness of the cooling jacket 12 and the heat insulation plate 16, while the thickness of the wafer chuck 10 is the same as that of the conventional one. Since the heat insulation ring 15 is thicker, a gap between the temperature control unit 14 and the heat insulating film 16 is greater than that of the conventional one to thereby reduce a heat transfer amount across the gap.

Next, an operation will be explained. For example, in case of performing a high temperature inspection on the wafer W, the wafer W transferred from the loader chamber L is mounted on the wafer chuck 10 in the prober chamber P, and then attractively held on the top plate 11 to be adhered to the top plate 11. The plate heater 13 of the temperature control unit 14 is operating in the wafer chuck 10 to heat the wafer W mounted on the top plate 11 to a specific inspection temperature via the cooling jacket 12.

At this time, the top plate 11, the cooling jacket 12 and the heat insulation ring 15 are thermally expanded. The cooling jacket 12 having the highest thermal expansion rate is thermally expanded with the first bolt 18A as a center outwardly relative to the top plate 11 and the heat insulation ring 15 in a marginal range of the through hole formed through the peripheral portion of the cooling jacket 12. Further, the part fixed by the second bolt 18B is thermally expanded outward together with the top plate 11 through the second bolt 18B by the same amount. Thus, even though the thermal expansion rate of the cooling jacket 12 is greater that those of the top plate 11 and the heat insulation ring 15, and there is a difference of the thermal expansion rate between the cooling jacket 12 and the top plate 11, or between the cooling jacket 12 and the heat insulation ring 15, the flatness of the surface of the top plate 11 can be maintained. Since the thermal expansion of the top plate 11 and the heat insulation ring 15 is the same, the initial flatness of the top plate 11 can be maintained, so that the temperature of the wafer W can be raised in a short time up to the inspection temperature without changing the state of the wafer W adhered to the top plate 11.

Further, since the cooling jacket 12 is thinner than the conventional one, the heat capacity of the cooling jacket 12 is reduced, thereby making it possible to heat the wafer W in a shorter time period. Moreover, since a gap between the plate heater 13 and the heat insulating film 16 is greater than that of the conventional one, a heat transfer amount from the plate heater 13 to the heat insulation plate 16 is reduced, and the thermal dissipation of the heat insulation plate 16 are suppressed. As a result, the heat discharged from the plate heater 13 can be additionally transferred to the side of the top plate 11.

Accordingly, elevating the temperature of the wafer W to the inspection temperature in a shorter time can improve the throughput. Further, in case of performing a low temperature inspection of the wafer W, the cooling jacket 12 is operating instead of the plate heater 13 of the temperature control unit 14 to cool the wafer W down to a specific inspection temperature. In this case, since the top plate 11 and the heat insulation ring 15 are contracted by the same amount and the cooling jacket 12 is contracted independently, the flatness of the top plate 11 can be maintained, and further, the temperature of the wafer W can be lowered down to the low inspection temperature in a short time.

As described above, in accordance with this embodiments since the top plate 11 is formed of ceramic, i.e. a SiC sintered body impregnated with Si, the stress is hardly accumulated in surface processing to improve the flatness of the surface (mounting surface of the wafer), while the deformation affected by the cooling jacket 12 can be prevented due to its high stiffness. As a result, the adhesivity of the top plate 11 and the wafer is enhanced, thereby shortening the time required for raising and lowering the temperature of the wafer. Further, the top plate 11 has a smaller specific gravity than the conventional metal one, thereby realizing the light-weight wafer chuck 10. Furthermore, since the top plate 11, the cooling jacket 12 and the plate heater 13 are fixed at each central portion by the first bolt 18A and the cooling jacket 12 is inserted between the top plate 11 and the heat insulation ring 15 in an outer peripheral portion with respect to the fixed part by the first bolt 18A, although the cooling jacket 12 is expanded or contracted with the first bolt 18A as a center independently of the top plate 11 and the heat insulation ring 15, the cooling jacket 12 is sliding between them to thereby maintain the flatness of the top plate 11 and suppress the deformation of the top table 11.

Moreover, in accordance with this embodiment, the top plate 11 and the heat insulation ring 15 are fixed to each other through the cooling jacket 12 by the second bolts 18B at a plurality of places spaced apart from each other in a circumferential, and further, each thermal expansion is substantially identical at the fixed part. Thus, even though the temperature of the top plate 11 changes from +25° C. to +150° C., the thermal expansion and contraction of the cooling jacket 12 is suppressed through the second bolt 18B, and the top plate 11 and the heat insulation ring 15 are expanded or contracted together by the same amount. Therefore, the top plate 11 is not deformed, and the flatness of the wafer-mounting of, e.g., 2.6 μm, can be maintained, resulting in a stable thermal conductivity.

In addition, in accordance with this embodiment, the insulation sheet 17 is interposed between the top plate 11 and the temperature control unit 14, so that the entire surface of the top plate 11 can be uniformly heated up or cooled down through the insulation sheet 17. Moreover, the top plate 11 is formed of ceramic, i.e. a SiC sintered body impregnated with Si, the cooling jacket 12 and the heat insulation plate 16 are formed thin, and the heat insulation ring 15 is formed thicker by the reduced thickness of the cooling jacket 12 and the heat insulation plate 16. Therefore, the heat capacity of the cooling jacket 12 is reduced, thereby making it possible for the top plate 11 to raise and lower the temperature of the wafer W in a shorter time period. Still further, since the gap between the temperature control unit 14 and the heat insulating film 16 is greater, heat transfer across the gap can be suppressed to enhance the temperature control efficiency of the wafer. Furthermore, the wafer chuck 10 can be lighter as the cooling jacket 12 and the heat insulation plate 16 are thinner.

Second Embodiment

In accordance with the first embodiment of the present invention, it is possible to shorten the time required for raising and lowering the temperature of the target object and realize lightweight by enhancing the thermal conductivity by way of improving the flatness of the top plate. Thus, in the mounting apparatus 10 of the first embodiment, the flatness of the top plate of about 2.6 μm is maintained although the temperature changes from +25° C. to +150° C. That is, the flatness is greatly improved in comparison with the conventional 10 μm flatness, therefore confirming the effect with respect to deformation.

However, by sequential experiments, it is noted that, in case of assembling the mounting apparatus 10, the flatness of the top plate 11 is influenced by irregularity of the lower member, i.e. the cooling jacket 12, the heat insulation ring 15 and the heat insulation plate 16, and therefore the flatness of the top plate 11 is deteriorated after the mounting apparatus 10 is assembled. This is because small irregularity occurred in manufacturing the cooling jacket 12 or the heat insulation ring 15 is inevitable, and thus the irregularity affects the flatness of the top plate 11 after the mounting apparatus 10 is assembled. Accordingly, as a result of considering the flatness of the assembled top plate 11 in various ways, the flatness of the assembled top plate 11 can be improved by devising a method for coupling the cooling jacket 12, the heat insulation ring 15 and the heat insulation plate 16.

A mounting apparatus 10A of this embodiment includes, for example, as shown in FIG. 3, the top plate 11, the temperature control unit 14 formed of the cooling jacket 12 and the plate heater 13 integrated with the top plate 11, and the heat insulation plate 16 integrated with the temperature control unit 14 through the heat insulation ring 15, and is configured to be identical to the mounting apparatus 10 of the first embodiment except for the coupling method by using a coupling member. Further, this preferred embodiment will now be described, wherein identical reference numerals will be used for the same or corresponding parts described in the first embodiment.

In this embodiment, as shown in FIG. 3, a first bolt 18A is located at a central portion of the plate heater 13 to couple the cooling jacket 12 and the plate heater 13. That is, a female screw portion which a male screw of the first bolt 18A is driven into is formed at a central portion of the cooling jacket 12, while a through hole through which the first bolt 18A passes is formed at a central portion of the plate heater 13. Therefore, the cooling jacket 12 and the plate heater 13 are fixed with each other by the first bolt 18A. Although the first bolt 18A couples the cooling jacket 12 to the plate heater 13 in this embodiment, it is also possible to fix the top plate 11, the cooling jacket 12 and the plate heater 13 all together by using the first bolt 18A.

A plurality of second bolts 18B, as shown in FIG. 3, is formed at specific intervals in a circumferential direction in the heat insulation ring 15 to couple the cooling jacket 12 and the heat insulation ring 15. That is, female screw portions into which male screws of the second bolts 18B are driven are formed at the peripheral portion of the cooling jacket 12. Further, the heat insulation ring 15 is provided with depressions for receiving the second bolts 18B, each of which has a through hole through which each second bolt 18B passes in a center portion of each depression. Therefore, the cooling jacket 12 and the heat insulation ring 15 are fixed together by the second bolts 18B inserted from the side of the heat insulation ring 15.

A plurality of third bolts 18C are arranged in a concentric circular shape between the central portion and the peripheral portion of the top plate 11 to couple the top plate 11, the cooling jacket 12 and the plate heater 13 all together. Namely, the top plate 11 is provided with a plurality of female screw portions into which male screws of the third bolts 18C are driven, and the cooling jacket 12 is provided with through holes into which axes of the third bolts 18C are movably inserted, while the plate heater 13 has through holes through which the third bolts 18C pass. Therefore, the top plate 11, the cooling jacket 12 and the plate heater 13 are coupled with each other by the third bolts 18C inserted from the side of the plate heater 13.

A plurality of fourth bolts 18D is formed at specific intervals in a circumferential direction in the peripheral portion of the heat insulation plate 16 to couple the heat insulation ring 15 and the heat insulation plate 16. Female screw portions into which male screws of the fourth bolts 18D are driven are formed at the heat insulation ring 15. Further, the heat insulation plate 16 is provided with depressions for receiving the fourth bolts 18D, each of which has a through hole through which each fourth bolt 18D passes in a center portion of each depression. Therefore, the heat insulation ring 15 and the heat insulation plate 16 are coupled together by the fourth bolts 18D inserted from the side of the heat insulation plate 16. Although the fourth bolt 18D is arranged in a line with the second bolt 18B in FIG. 3, actually, the axis of fourth bolt 18D is misaligned with that of the second bolt 18B in a circumferential direction.

Accordingly, as described above, this embodiment is different from the first embodiment in that a peripheral portion of the top plate 11 is not fixed by the second bolts 18B, and therefore, the top plate 11 is not influenced by the irregularity of the cooling jacket 12 and the heat insulation ring 15, thereby maintaining the original flatness of the top plate 11 without deteriorating it. In the first embodiment, the flatness of the top plate 11 itself is 3.8 µm, whereas the flatness of the top plate 11 assembled into the mounting apparatus 10 is deteriorated to 7.4 µm. With regard to this, the top plate 11 in the mounting apparatus 10A of this embodiment is not influenced by the cooling jacket 12 and the heat insulation ring 15, so the flatness of the assembled top plate 11 is improved to 4.7 µm.

Furthermore, since the peripheral portion of the top plate 11, which has the highest thermal expansion difference with the cooling jacket 12, is not fixed to the cooling jacket 12 and the heat insulation ring 15, the thermal deformation caused by the thermal expansion difference between the top plate 11 and the cooling jacket 12 can be suppressed. Resultantly, even when the temperature of the top plate 11 changes from +25° C. to +150° C., the flatness thereof changes only by 1.3 µm, thus making it possible to significantly suppress the deformation in comparison with the deformation of 2.6 µm in the first embodiment.

As described above, in accordance with this embodiment, since the peripheral portion of the top plate 11 is not fixed to the cooling jacket 12 and the heat insulation ring 15, the flatness of the top plate 11 assembled into the mounting apparatus 10A is greatly enhanced, while the flatness of the top plate 11 can be improved by suppressing the effect of the thermal expansion difference between the top plate 11 and the cooling jacket 12 even when the temperature changes from a normal temperature to a high temperature of +150° C.

Third Embodiment

As a result of examining the heating or cooling by the mounting apparatuses 10 and 10A of the first and second embodiments as well as by the conventional mounting apparatus, it is found that, a peripheral surface of structural parts such as the top plate or the like is exposed, and therefore, although the coupling method of the top plate or the like can be improved, the temperature of the peripheral portion of the top plate is decreased or increased by external factors such as heat dissipation from the peripheral surface of the structural parts like the top plate or heat absorption from outside to influence the inspection.

Therefore, this embodiment is configured to suppress the above-mentioned temperature variation by way of attaching a temperature control plate ring to a peripheral surface of a mounting apparatus. Hereinafter, a mounting apparatus 10B of this embodiment will be described with reference to FIG. 4.

The mounting apparatus 10B of this embodiment includes, for example, as shown in FIG. 4, the top plate 11, the temperature control unit 14 formed of the cooling jacket 12 and the plate heater 13, the heat insulation ring 15 and the heat insulation plate 16, and is configured to be identical to the mounting apparatus 10A of the second embodiment except for the temperature control plate ring 19 attached to a peripheral surface of the mounting apparatus 10B. Further, in the present embodiment, identical reference numerals will be used for the same or corresponding parts described in the second embodiment.

That is, the top plate 11, the cooling jacket 12, the plate heater 13 and the heat insulation ring 16 are integrally coupled to each other in this embodiment in the same manner as the second embodiment. That is, the cooling jacket 12 and the plate heater 13 are fixed at each central portion by the first bolt 18A as shown in FIG. 4, while the cooling jacket 12 and the heat insulation ring 15 are coupled to each other by a plurality of second bolts 18B formed at specific intervals in a circumferential direction. The top plate 11, the cooling jacket 12 and the plate heater 13 are coupled all together by third bolts 18C arranged at specific intervals in a plurality of concentric circles each center of which is the first bolt 18A, as shown in FIG. 4. Further, the heat insulation ring 15 and the heat insulation plate 16 are coupled to each other by a plurality of fourth bolts 18D arranged at specific intervals in each circumferential direction. An attaching part of the temperature control plate ring 19 described below is interposed between the fourth bolts 18D and the heat insulation plate 16, and the temperature control plate ring 19 is attached to the heat insulation plate 16 through the fourth bolts 18D.

Thus, in this embodiment, as shown in FIG. 4, the temperature control plate ring 19 is attached to the heat insulation plate 16 to surround a peripheral surface of the top plate 11, the cooling jacket 12, the heat insulation ring 15 and the heat insulation plate 16, and therefore a gap 6 is formed between the temperature control plate ring 19 and the above peripheral surface. The temperature control plate ring 19 is made of a metal having a thermal conductivity equal to or lower than 17

W/mK, for example, stainless steel or the like. Further, both sides of the temperature control plate ring 19 are formed of a mirror surface to easily reflect the heat emitted from the top plate 11, the plate heater 13, or the like, and suppress the heat emission from outside of the temperature control plate ring 19.

Herein, an attaching structure of the temperature control plate ring 19 will be described in detail. As shown in FIG. 4, a flange portion 11A is formed at an upper portion of the top plate 11, and a reduced diameter portion 11B having a smaller diameter than that of the flange portion 11A is formed at the other portion. An outer diameter of the flange portion 11A is substantially the same as that of the temperature control plate ring 19 as well as those of the top plate 11 of the first and second embodiments. Further, a flange portion 16A and a reduced diameter portion 16B are formed in the heat insulation plate 16 in the same manner as the top plate 11.

As shown in FIG. 4, the temperature control plate ring 19 is formed of a main body 19A and an attaching part 19B, the attaching part 19B being formed by a lower end of the main body 19A protruded toward its center, and is attached to the flange portion 16A of the heat insulation plate 16 through the attaching part 19B. Further, the gap 6 is formed between the main body 19A of the temperature control plate ring 19 and the reduced diameter portion 11B of the top plate 11. Further, it is preferable that a top portion of the main body 19A should not contact with the flange portion 11A of the top plate 11 so that the heat cannot be conducted from the top plate 11. The temperature control plate ring 19 is made of a metal having a low thermal conductivity, e.g., stainless steel, and further, both sides thereof are formed of a mirror surface. Since the temperature control plate ring 19 is made of a metal having a low thermal conductivity, it is possible to slow down temperature rising or falling caused by the heat insulation plate 16. Further, since both sides of the temperature control plate ring 19 are formed of a mirror surface, the heat is easily reflected, and at the same time the heat emission amount is reduced.

As shown in FIG. 4, the cooling jacket 12 has a diameter substantially the same as that of the reduced diameter portion 11B of the top plate 11. Further, like the cooling jacket 12, the heat insulation ring 15 has a diameter substantially the same as that of the reduced diameter portion 11B of the top plate 11. Thereby, the gap δ is formed between the main body 19A of the temperature control plate ring 19 and the peripheral surface of the cooling jacket 12 and the heat insulation ring 15.

Moreover, since the temperature control plate ring 19 is attached to the heat insulation ring 16 made of ceramic, but not directly contacted with the top plate 11, the cooling jacket 12 and the heat insulation ring 15 with the gap δ interposed therebetween, the heat is not directly conducted from these members to the temperature control plate ring 19.

Consequently, although the top plate 11 is heated by the plate heater 13 in the high temperature inspection, the temperature control plate ring 19 is not directly heated by the members such as the top plate 11 or the like. Besides, since the temperature control plate ring 19 is formed of a mirror surface, the heat emitted from the members such as the top plate 11 and the like can be easily reflected inwardly and the heat dissipation to outside can be effectively suppressed. Therefore, the temperature reduction of the top plate 11 can be prevented. Furthermore, the temperature control plate ring 19 is attached to the heat insulation plate 16 located farthest from a heat source of the plate heater 13 and the cooling jacket 12, and the temperature of the temperature control plate ring 19 itself rises slowly due to its low conductivity, whereby the temperature reduction of the mounting apparatus 10 can be effectively prevented. Accordingly, in the high temperature inspection, e.g., at 150° C., variation of the temperature distribution on the surface of the top plate 11 is suppressed from 1.3° C. to 0.9° C. to thereby provide improved wafer inspection reliability.

On the other hand, in a low temperature inspection, even though the members such as the top plate 11 and the like are cooled down by the cooling jacket 12 and therefore the temperature difference with the temperature control plate ring 19 increases, the heat is not directly conducted from the temperature control plate ring 19 to the members such as the top plate 11 and the like, and the temperature elevation of the top plate 11 or the like can be prevented. Accordingly, the temperature elevation of the members such as the top plate 11 and the like can be effectively suppressed without the influence of the external factors like the external temperature.

In accordance with this embodiment as described above, the temperature control plate ring 19 surrounding the top plate 11, the cooling jacket 12, and the heat insulation ring 15 is attached to the heat insulation plate 16, and the gap δ is formed between the temperature control plate ring 19 and the peripheral surface of the top plate 11, the cooling jacket 12, and the heat insulation ring 15. Therefore, the temperature reduction of the top plate 11 can be effectively suppressed in the high temperature inspection, whereas the temperature elevation of the top plate 11 can be effectively suppressed in the low temperature inspection. Further, since both sides of the temperature control plate ring 19 is formed of a mirror surface, the heat emitted from the top plate 11, the cooling jacket 12 and the heat insulation ring is reflected inwardly, while the heat dissipation to outside is suppressed in the high temperature inspection, whereby the temperature reduction at the peripheral portion of the top plate 11 can be suppressed. On the other hand, in the low temperature inspection, the heat is not directly conducted from the temperature control plate ring 19 to the top plate 11, so the temperature elevation at the peripheral portion of the top plate 11 can be suppressed.

Furthermore, the present invention is not limited to the above embodiments, but various modifications of each component may be made as occasion demands. For example, though the above embodiments have been described with respect to the temperature control unit 14 including the cooling jacket 12 serving as a cooling element and the plate heater 13 serving as a heating element, any temperature control unit which has at least one of the cooling element and heating element and can control the surface plate serving as the top plate 11 can be employed as the temperature control unit 14. Further, although the above embodiments have been described with respect to the top plate 11 formed of ceramic, i.e. a SiC sintered body impregnated with Si, any ceramic having the identical characteristics can be used in the same manner. Furthermore, the above preferred embodiments have been described with respect to the mounting apparatus used for the inspection apparatus, however, the present invention can be utilized as a mounting apparatus in various processing apparatuses where its temperature is required to be controlled from a low temperature to a high temperature when a target object such as a wafer or the like is processed.

While the invention has been shown and described with respect to the embodiments, it will be understood by those skilled in the art that various changes and modifications may be made without departing from the spirit and scope of the invention as defined in the following claims.

What is claimed is:

1. A mounting apparatus comprising:
a surface plate;
a temperature control unit integrated with the surface plate; and
a bottom plate integrated with the temperature control unit via a heat insulation ring,
wherein a temperature of a target object held on the surface plate is controllable,
wherein the surface plate is formed of ceramic,
wherein a central portion of the surface plate is coupled to the temperature control unit via first coupling members such that a peripheral portion of the surface plate is not coupled to a peripheral portion of the temperature control unit,
wherein the peripheral portion of the temperature control unit is coupled to the heat insulation ring by second coupling members,
wherein the first coupling members include first female screw portions disposed in the central portion of the surface plate and first male screws,
wherein the temperature control unit includes first through holes,
wherein the surface plate and the temperature control unit are fixed together via the first male screws inserted into the first female screw portions via the first through holes,
wherein the second coupling members include second female screw portions disposed in the peripheral portion of the temperature control unit and second male screws,
wherein the heat insulation ring includes depressions having second through holes,
wherein the temperature control unit and the heat insulation ring are fixed together by the second male screws inserted into the second female screw portions via the second through holes, and
wherein the second male screws are received in the depressions.

2. The mounting apparatus of claim 1, wherein the first coupling members are arranged in a concentric circular shape with respect to the surface plate and the temperature control unit.

3. The mounting apparatus of claim 1, further comprising a temperature control plate ring attached to the bottom plate and surrounding the surface plate, the temperature control unit, and the heat insulation ring,
wherein a gap is formed between the temperature control plate ring and a peripheral surface of the surface plate, the temperature control unit, and the heat insulation ring.

4. The mounting apparatus of claim 3, wherein both sides of the temperature control plate ring is formed of a mirror surface.

5. The mounting apparatus of claim 3, wherein the temperature control plate ring is made of a material having a thermal conductivity equal to or lower than 17 W/mK.

6. The mounting apparatus of claim 1, wherein an insulation sheet is interposed between the surface plate and the temperature control unit.

7. The mounting apparatus of claim 6, wherein the temperature control unit is formed of a cooling element and/or a heating element.

8. The mounting apparatus of claim 1, wherein the ceramic is a composite material of silicon carbide and silicon.

9. The mounting apparatus of claim 1, wherein the bottom plate is coupled to the heat insulation ring by third coupling members,
wherein the third coupling members include third female screw portions disposed in the heat insulation ring and third male screws,
wherein the bottom plate includes third through holes, and
wherein the heat insulation ring and the bottom plate are fixed together by the third male screws inserted into the third female screw portions via the third through holes of the bottom plate.

\* \* \* \* \*